United States Patent [19]

Ipri

[11] Patent Number: 4,597,160
[45] Date of Patent: Jul. 1, 1986

[54] METHOD OF FABRICATING A POLYSILICON TRANSISTOR WITH A HIGH CARRIER MOBILITY

[75] Inventor: Alfred C. Ipri, Princeton, N.J.

[73] Assignee: RCA Corporation, Princeton, N.J.

[21] Appl. No.: 763,968

[22] Filed: Aug. 9, 1985

[51] Int. Cl.[4] .................... H01L 21/94; H01L 21/322
[52] U.S. Cl. ..................... 29/571; 148/174;
    148/DIG. 1; 148/DIG. 118; 427/86
[58] Field of Search ....... 148/DIG. 1, 174, DIG. 118,
    148/DIG. 122; 427/86; 29/571

[56] References Cited

U.S. PATENT DOCUMENTS

| | | | |
|---|---|---|---|
| 3,093,507 | 6/1963 | Lander et al. | 117/201 |
| 3,396,052 | 8/1968 | Rand | 117/201 |
| 3,900,345 | 8/1975 | Lesk | 148/1.5 |
| 3,900,597 | 8/1975 | Chruma et al. | 427/82 |
| 3,911,168 | 10/1975 | Schinella et al. | 427/93 |
| 4,358,326 | 11/1982 | Doo | 148/174 |
| 4,376,657 | 3/1983 | Nagasawa et al. | 148/1.5 |

OTHER PUBLICATIONS

Applied Physics Letters, vol. 42, No. 9, May 1, 1983, Kinsbron et al., "Crystallization of Amorphous Silicon Films During LPCVD", pp. 835–837.
Ghandhi, S. K., "VLSI Fabrication Principles", 1983 by John Wiley & Sons, Inc., pp. 430–435.

*Primary Examiner*—Aaron Weisstuch
*Assistant Examiner*—Tuan N. Quach
*Attorney, Agent, or Firm*—Birgit E. Morris; William J. Burke; Henry Steckler

[57] ABSTRACT

A method for making a TFT comprises forming an amorphous silicon layer having a smooth upper surface. An insulating layer is then formed on the smooth surface at or below the critical temperature for the instantaneous crystallization of amorphous. This slowly converts the amorphous silicon to polycrystalline silicon while retaining the smooth surface. TFTs incorporating the invention have a relatively high field effect (surface) mobility.

12 Claims, 4 Drawing Figures

METHOD OF FABRICATING A POLYSILICON TRANSISTOR WITH A HIGH CARRIER MOBILITY

BACKGROUND OF THE INVENTION

The present invention relates to a method of making a transistor, and more particularly to such a method applied to a field effect thin film transistor (TFT).

In forming a TFT, it is desired to use for the active layer (the layer having the source, drain, and channel regions) amorphous silicon (a-Si) or polycrystalline silicon (p-Si), also called "polysilicon", for reasons of economy. Further, a high mobility is required of a TFT due to the frequencies of signals applied thereto in many applications. On the active area an insulating layer, such as silicon dioxide ($SiO_2$), is disposed; on the insulating layer a gate comprising heavily doped a-Si or p-Si is deposited. If $SiO_2$ is deposited as the insulating layer on either a-Si or p-Si, it has been found that carrier traps are present in the insulating layer. The trapped electrons produce a shift in the threshold voltage of the TFT. If the $SiO_2$ is grown on p-Si, then it preferentially grows along the grain boundaries of the p-Si, thereby producing a rough surface on the p-Si. This roughness increases the surface scattering thereby reducing the carrier field effect (surface) mobility in the channel region of the TFT. If the $SiO_2$ is grown on a-Si at a temperature significantly below the critical temperature, the a-Si typically does not have sufficient time to crystallize. This a-Si active layer has a low field effect mobility since it has a greater degree of disorder as compared with p-Si.

SUMMARY OF THE INVENTION

The invention is a method for forming a transistor comprising forming an amorphous silicon layer having a smooth surface and heating the amorphous silicon in an oxidizing ambient at or slightly below the critical temperature to grow an insulating layer on said smooth surface and to convert said amorphous silicon to polycrystalline silicon. Since the crystallization takes place slowly, the smooth surface is retained. The resulting polycrystalline transistor has a higher field effect mobility as compared to a polycrystalline transistor fabricated without the smooth interface or to an amorphous silicon transistor.

DETAILED DESCRIPTION OF THE PREFERRED EMBODIMENT

Figure 1:
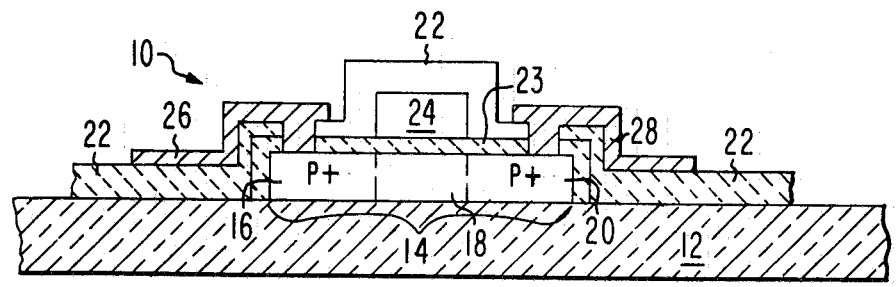
FIG. 1 is a cross-sectional view of a TFT made in accordance with the invention.

In FIG. 1, a thin film transistor 10 is disposed on a substrate 12, such as glass. An active layer 14 overlies a surface of the substrate 12 and is composed of p-Si. The active layer 14 includes P+-type conductivity source and drain regions 16 and 20 with a channel region 18 therebetween. Disposed above and to the sides of the active layer 14 is a first insulating layer 23, such as silicon dioxide ($SiO_2$). Above the channel region 18 and within a second insulating layer 22 is a p-Si gate 24. Metallizations 26 and 28 respectively provide electrical contacts to the source 16 and drain 20.

Figure 2:
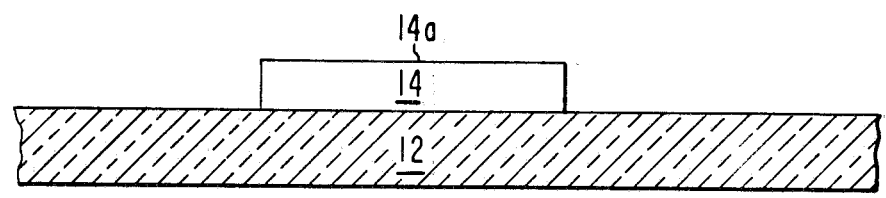
FIGS. 2, 3, and 4 are cross-sectional views of the TFT of FIG. 1 during the successive manufacturing steps.

FIG. 2 shows the first step of depositing the active layer 14 using low pressure chemical vapor deposition (LPCVD) of silicon from silane ($SiH_4$) at a substrate temperature of about 550° C. to 570° C., preferably about 560° C., to obtain a thickness between about 100 to 500 nanometers (nm). Since this temperature is below the critical temperature $T_c$ for instantaneous conversion of amorphous to polycrystalline silicon (about 620° C.), the active layer 14 comprises a-Si having a smooth upper surface 14a. At lower temperatures crystallization can still occur but at a much slower rate. In particular, the crystallization time includes an incubation time for nucleation to occur and a further time for the silicon to epitaxially crystallize outwardly from the nucleus. The rates for both of these processes decreases markedly with decreasing temperature. The active layer 14 is then defined by photoresist and etching techniques as known in the art.

Figure 3:
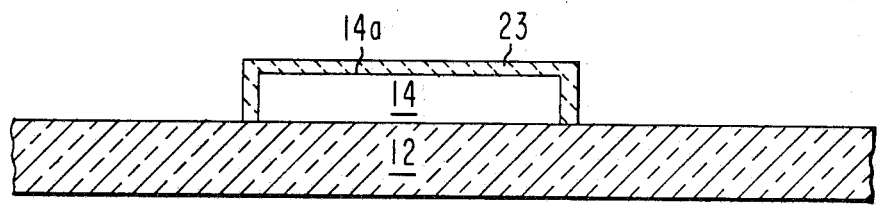

FIG. 3 shows the next step of heating the active layer 14 at or slightly below $T_c$ in an oxidizing ambient, in particular heating to between about 580° C. and 620° C., in a 100 percent steam ambient to grow the $SiO_2$ first insulating layer 23. For example, to grow a 60 nm thick layer 23 at 600° C., about 120 hours is needed. If desired a longer or shorter time can be used to grow a thicker or thinner insulating layer 22a. During this step crystallization (conversion of a-Si to p-Si) of the active layer 14 occurs; however it occurs sufficiently slowly (a few hours at 600° C.) that the smooth character of the surface 14a is not changed. Thus the completed TFT 10 will have a higher field effect mobility than if the surface 14a did not remain smooth.

Figure 4:
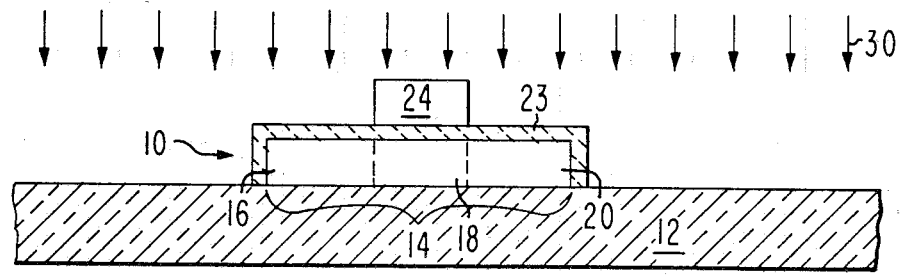

FIG. 4 shows the next step of using LPCVD from $SiH_4$ to form a 500 nm thick second a-Si layer. This layer is then conventionally defined to produce the gate 24. To make a P-channel TFT 10, the entire device is then subjected to implantation of boron ions at 35 Kiloelectron volts (KeV) with an areal density of $8 \times 10^{15}$ ions/cm$^2$ as indicated by arrows 30. In order to fabricate an N-channel device, an N-type conductivity modifier, such as phosphorus or arsenic, can be ion implanted instead of boron. The gate 24 masks the channel region 18 from any ions, but the source 16 and drain 20 regions are thereby formed as P+-type conductivity regions. The TFT 10 is then heated to about 600° C. for 4 hours to activate the ion implant and also to convert the gate 24 to p-Si, thus lowering its resistance. Preferably, this is done in an oxidizing ambient, such as steam or dry $O_2$, so that a very thin layer (not shown) of $SiO_2$ which is very clean (free of impurities) is formed on the top and sides of the gate 24. Steam is more desirable than $O_2$ due to its faster oxidizing rate.

The remaining steps are conventional. The layer 22 of $SiO_2$ is deposited using CVD at a pressure of one atmosphere of $SiH_4$ and $O_2$ to a thickness of about 500 to 1,000 nm. Contact openings to the source 16 and the drain 20 are then defined. Thereafter aluminum is sputtered or evaporated and then defined to form the metallizations 26 and 28. Finally, a silicon nitride sealing layer, (not shown) can be deposited using LPCVD.

EXAMPLE

TFTs have been fabricated in accordance with the invention with an active layer deposited using LPCVD at 560° C. with a thickness of 200 nm and an insulating layer grown at 600° C. for 120 hours in a steam ambient at one atmosphere to a thickness of 60 nm. Such TFTs have typical field effect mobilities in the range of from 15 cm²/v-s to 50 cm²/v-s as measured from the TFT conductivity date.

COMPARATIVE EXAMPLE

TFTs have also been fabricated to have an active layer deposited using LPCVD at 560° C. with a thickness of 200 nm as in the example in accordance with the invention given above. However, in contradistinction to the TFTs made in accordance with the invention, these TFTs had an insulating layer grown at 700° C. for 15 hours, 750° C. for 6 hours, 800° C. for 2.5 hours, and 850° C. for 1 hour, respectively, all having an insulating layer thickness of 90 nm±5 nm. All other manufacturing parameters were the same as that of the TFTs made in accordance with the invention. Such TFTs had mobilities of from 1 to 4 cm²/v-s.

The present invention is useful as a driver transistor for a liquid crystal display and also with electroluminescent displays. Such displays require driver transistors with a typical mobility of at least 10 cm²/v-s when displaying a standard television signal due to the frequencies involved. Further, since a large number of such transistors are required, the fabrication method must be inexpensive, TFTs made in accordance with the present invention meet these requirements.

What is claimed is:

1. A method for making a transistor comprising:
    forming a first amorphous silicon layer on a substrate to obtain a smooth surface on said layer;
    heating said amorphous silicon layer in an oxidizing ambient at or slightly below the critical temperature of silicon to form an insulating layer on said smooth surface and to convert said amorphous silicon layer to a polycrystalline silicon layer while retaining said smooth surface;
    forming a gate on said insulating layer; and
    forming source and drain regions in said silicon layer adjacent said gate.

2. The method of claim 1, wherein said first recited forming step comprises depositing said amorphous silicon layer by low pressure chemical vapor deposition at a substrate temperature of about 550° C. to 570° C.

3. The method of claim 2, wherein said depositing step comprises depositing at a substrate temperature of about 560° C.

4. The method of claim 1, wherein said first recited forming step comprises forming said silicon layer with a thickness of about 100 nm to 500 nm.

5. The method of claim 1, wherein said heating step comprises growing said insulating layer at a substrate temperature between about 580° C. and 620° C.

6. The method of claim 5, wherein said growing step comprises growing at a substrate temperature of about 600° C.

7. The method of claim 6, wherein said growing step has a duration of about 120 hours and said oxidizing ambient comprises steam.

8. The method of claim 1, wherein said step of forming said gate comprises depositing and defining a second amorphous silicon layer.

9. The method of claim 8, further comprising converting said second amorphous silicon layer to a polycrystalline silicon layer.

10. The method of claim 9, wherein said step of converting said second amorphous layer comprises heating said layer to about 600° C. for about 4 hours.

11. The method of claim 1, wherein said step of forming source and drain regions comprises ion implanting a conductivity modifying dopant.

12. The method of claim 11, wherein said ion implanting step comprises implanting boron with an areal density of about $8 \times 10^{15}$ ions/cm².

* * * * *